(12) United States Patent
Trombert

(10) Patent No.: US 12,203,963 B2
(45) Date of Patent: Jan. 21, 2025

(54) CURRENT TRANSDUCER

(71) Applicant: LEM INTERNATIONAL SA, Meyrin (CH)

(72) Inventor: Stéphan Trombert, Leschaux (FR)

(73) Assignee: LEM International SA, Meyrin (CH)

( * ) Notice: Subject to any disclaimer, the term of this patent is extended or adjusted under 35 U.S.C. 154(b) by 0 days.

(21) Appl. No.: 18/293,401

(22) PCT Filed: Jul. 19, 2022

(86) PCT No.: PCT/EP2022/070270
§ 371 (c)(1),
(2) Date: Jan. 30, 2024

(87) PCT Pub. No.: WO2023/011916
PCT Pub. Date: Feb. 9, 2023

(65) Prior Publication Data
US 2024/0264203 A1    Aug. 8, 2024

(30) Foreign Application Priority Data
Jul. 31, 2021    (EP) ..................................... 21188975

(51) Int. Cl.
*G01R 15/18*    (2006.01)
*G01R 19/00*    (2006.01)

(52) U.S. Cl.
CPC ....... *G01R 15/183* (2013.01); *G01R 19/0092* (2013.01)

(58) Field of Classification Search
CPC .......................... G01R 15/183; G01R 19/0092
See application file for complete search history.

(56) References Cited

U.S. PATENT DOCUMENTS 11,536,747 B2 * 12/2022 Weinstein ............ H05K 5/0004
11,555,834 B2 *  1/2023 Takahashi ................ G01R 3/00
(Continued)

FOREIGN PATENT DOCUMENTS

GB        825137       12/1959
JP     2011158337 A  *  8/2011
WO   WO-2013161496 A1 * 10/2013   ........... G01R 15/207

OTHER PUBLICATIONS

International Search Report and Written Opinion issued by the International Searching Authority, dated Aug. 11, 2022, for International Patent Application No. PCT/EP2022/070270; 12 pages.

*Primary Examiner* — Dominic E Hawkins
(74) *Attorney, Agent, or Firm* — Faegre Drinker Biddle & Reath LLP

(57) ABSTRACT

Electric current transducer comprising a housing, a magnetic core and a magnetic field detection system, the magnetic core surrounding a primary conductor passage for receiving a primary conductor therethrough, the magnetic core comprising a first part and a second part assembled in the housing so as to form a first magnetic circuit gap and a second magnetic circuit gap, the magnetic field detection system comprising a first magnetic field detector positioned in the first magnetic circuit gap and a second magnetic field detector positioned in the second magnetic circuit gap, the first and second magnetic circuit gaps being disposed on opposing sides of magnetic core, each of the first and second parts comprising a pair of lateral branches, joined by a bridging branch.

11 Claims, 5 Drawing Sheets

(56) References Cited

U.S. PATENT DOCUMENTS

| | | | |
|---|---|---|---|
| 2008/0186021 A1* | 8/2008 | Hashio | G01R 15/207 264/254 |
| 2013/0027033 A1* | 1/2013 | Lenhard | G01R 15/185 324/253 |
| 2016/0231362 A1* | 8/2016 | Nanshan | H01F 38/30 |
| 2021/0293858 A1* | 9/2021 | Takahashi | G01R 3/00 |

* cited by examiner

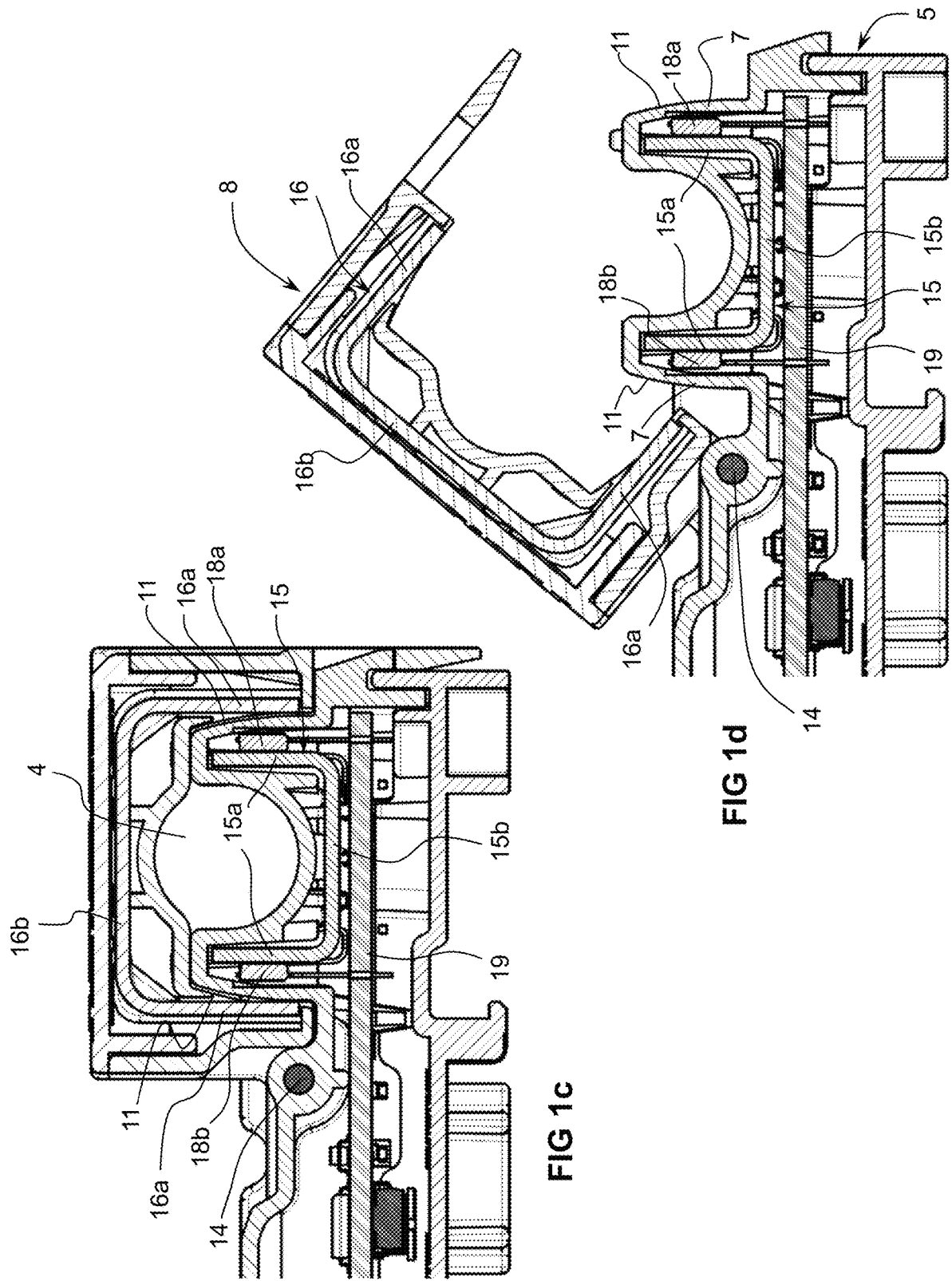

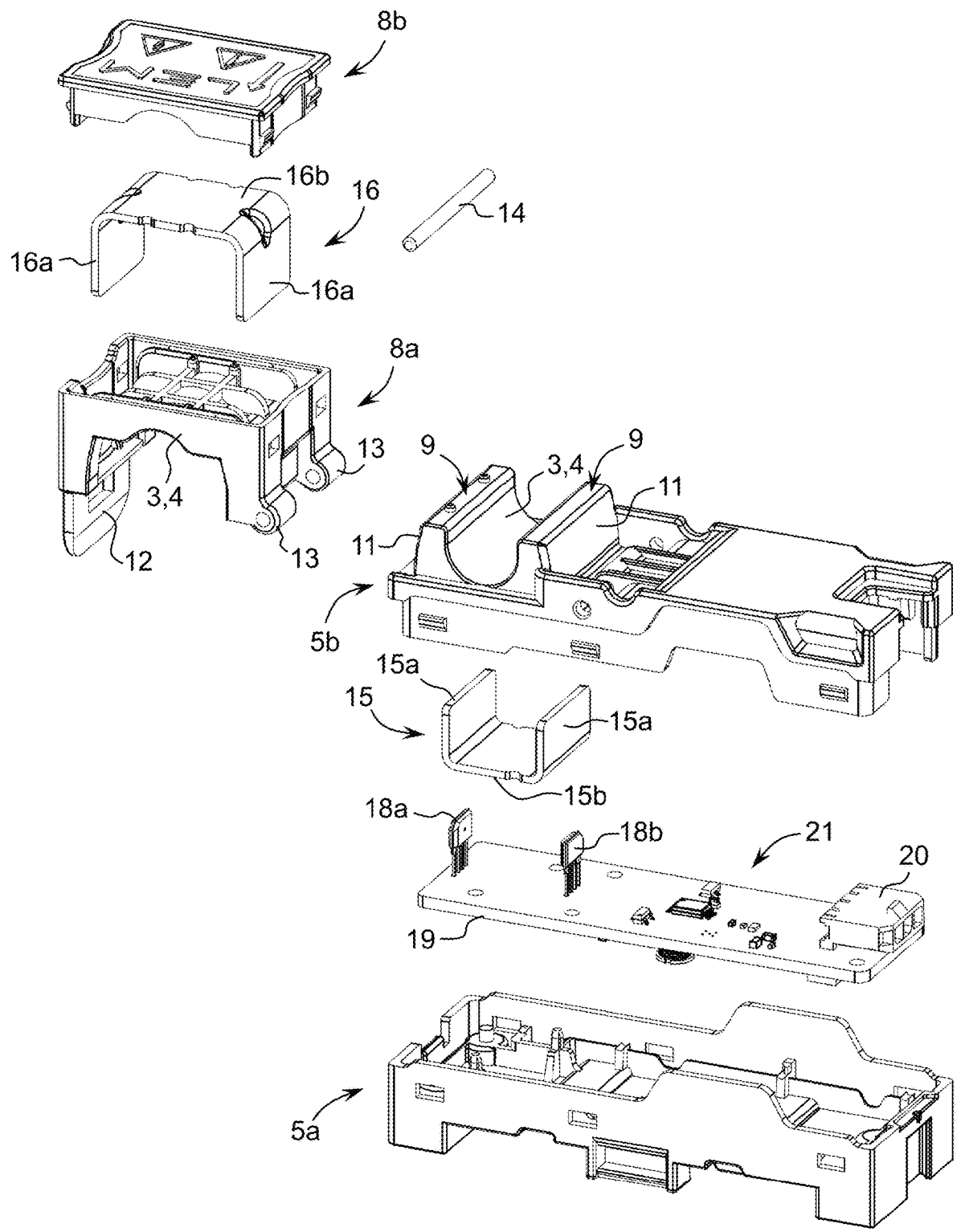

CURRENT TRANSDUCER

CROSS-REFERENCE TO RELATED APPLICATIONS

The present application is a national stage entry of International (PCT) Patent Application Number PCT/EP2022/070270, filed Jul. 19, 2022, which claims priority to European Patent Application Number 21188975.3, filed Jul. 31, 2021, the complete disclosures of which are expressly incorporated herein by reference.

The present invention relates to a current transducer with a magnetic core surrounding a central passage configured for receiving one or more primary conductors for measuring a current flowing in said one or more conductors.

A well-known type of current transducer comprises a magnetic core with an airgap in which a magnetic field detector, such as a Hall effect sensor is positioned to measure the magnetic field generated by the current flowing in the primary conductor. Such transducers may be of the open loop type or the closed loop type, the latter typically having a compensation coil that generates a secondary current seeking to cancel the magnetic field generated by the primary current to be measured.

In some current transducers, there are two airgaps and two magnetic field detectors, one in each airgap. The airgaps and magnetic field detectors are typically provided on opposed sides of the magnetic circuit in a symmetrical arrangement. One of the advantages of providing a pair of airgaps is to provide the magnetic core in two parts, typically two U-shaped parts that may be separated to allow a primary conductor to be positioned within the central passage surrounded by the magnetic core when they are assembled together.

Two part magnetic cores with only one airgap within which a magnetic field detector is positioned are also known, however greater measurement sensitivity and accuracy with reduced saturation of the magnetic is achievable with two part magnetic cores having two airgaps, each with a magnetic field detector.

In conventional transducers with a pair of magnetic field detectors and corresponding airgaps, the accuracy of the transducer is adversely affected by a difference in the airgap length. Such differences may arise especially in transducer arrangements allowing the primary conductor to be inserted and removed from the central passage due to the amount of play that is required for opening and closing of the magnetic core.

In view of the foregoing, it is an object of the invention to provide a current transducer with a two part magnetic core that is accurate and economical to produce, in particular for applications in which the magnetic circuit may be opened to allow positioning of a primary conductor within a central passage of the magnetic core.

It is advantageous to provide a current transducer of the aforementioned sort that has a reduced variation in the accuracy of measurement due to manufacturing tolerances and the positional tolerance due to moving parts.

It is advantageous to provide a current transducer that is compact.

It is advantageous to provide a current transducer that is easy to install and to use.

Objects of the invention have been achieved by providing the current transducer according to claim 1.

Disclosed herein is an electric current transducer comprising a housing, a magnetic core and a magnetic field detection system, the magnetic core surrounding a primary conductor passage for receiving a primary conductor therethrough. The magnetic core comprises a first part and a second part assembled in the housing so as to form a first magnetic circuit gap and a second magnetic circuit gap, the magnetic field detection system comprising a first magnetic field detector positioned in the first magnetic circuit gap and a second magnetic field detector positioned in the second magnetic circuit gap. The first and second magnetic circuit gaps are disposed on opposing sides of magnetic core, each of the first and second parts comprising a pair of lateral branches, joined by a bridging branch. The lateral branches of the first and second magnetic core parts overlap such that the lateral branches of the first part of the magnetic core are positioned adjacent an inner side of the lateral branches of the second part of the magnetic core, said first and second magnetic circuit gaps being formed between an outer side of the lateral branches of the first part and an inner side of the lateral branches of second part.

In an advantageous embodiment, the magnetic core first part and second part are both U-shaped.

In an advantageous embodiment, the housing comprises a base housing and a cover housing movable with respect to the base housing from an open position in which the primary conductor can be placed in the primary conductor passage, to a closed and locked position in which the magnetic core completely surrounds the primary conductor passage, one of the first and second parts of the magnetic core being mounted in the base and the other of the first and second parts of the magnetic core being mounted in the cover.

In an advantageous embodiment, the cover housing is hingeably coupled to the base housing.

In an alternative embodiment, the cover housing is removably coupled to the base housing.

In an advantageous embodiment, the lateral branches of the magnetic core first part are received in corresponding cavities in the base housing, the magnetic field detectors being mounted in said same cavities:

In an advantageous embodiment, the magnetic core receiving portions comprises outer guide walls for lateral branches having an outer surface guiding a complementary guide walls for lateral branches on the cover housing in the closed position.

In an advantageous embodiment, the guide walls are tapered.

In an advantageous embodiment, the first part of the magnetic core is positioned in the base housing and the second part of the magnetic core positioned in the cover housing.

In an advantageous embodiment, the magnetic field detectors are in the form of ASICs mounted on a circuit board of an electronic circuit mounted in the base housing.

In an advantageous embodiment, the ASICs are arranged upstanding orthogonally from the circuit board when positioned in corresponding cavities of the housing in abutment against the corresponding lateral branches of the first part of the magnetic core.

Further objects and advantageous features of the invention will be apparent from the claims, from the detailed description, and annexed drawings, in which:

FIG. 1b is a cross-sectional view through lines 1b-1b of FIG. 1a;

FIG. 1c is an enlarged view of a portion of a portion of FIG. 1b;

FIG. 1d is a view similar to FIG. 1c showing the magnetic core in an open position for insertion of a primary conductor in a central passage of the magnetic core;

FIG. 2 is a perspective exploded view of the current transducer according to an embodiment of the invention;

Figure 1A:
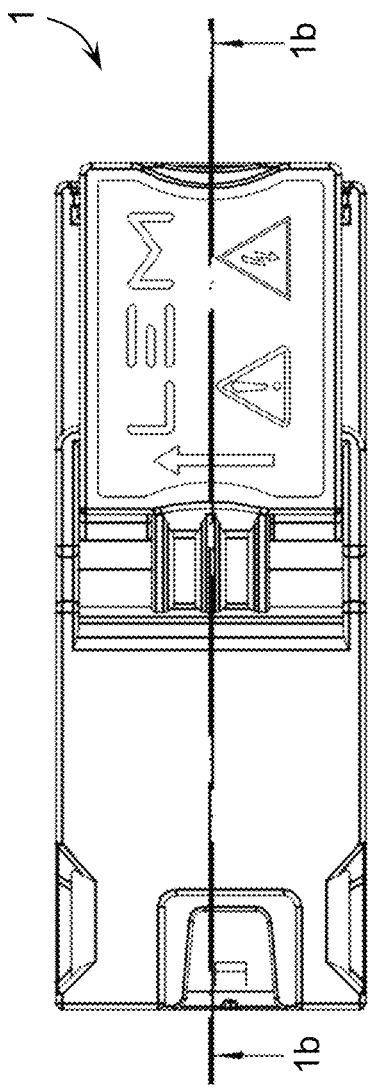
FIG. 1a is a top view of a current transducer according to an embodiment of the invention.
Figure 1B:
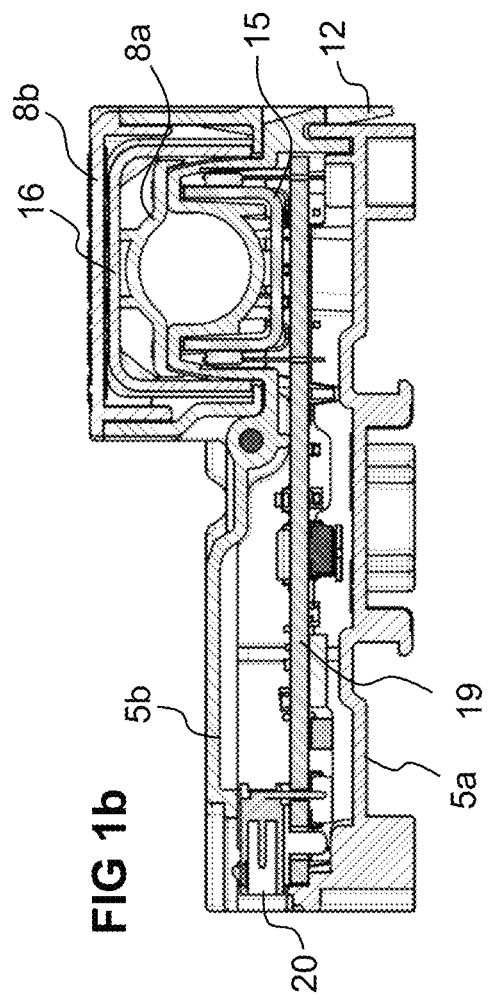
Figure 3:
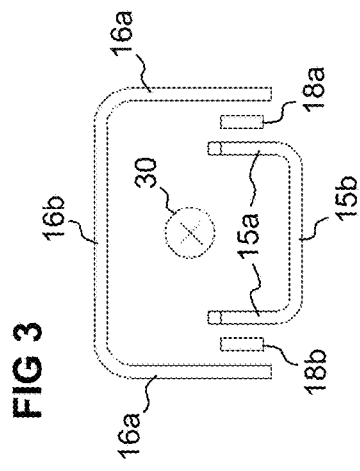
FIG. 3 is a schematic cross-sectional view through a magnetic core and magnetic field detectors of a current transducer according to an embodiment of the invention.

Referring to the figures, an electric current transducer 1 for measuring a current in one or more primary conductors 3 comprises a housing 2, a magnetic core 15, 16, a magnetic field detection system 18a, 18b, and an electronic circuit 21 mounted within the housing. The housing 2 has a primary conductor receiving portion defining a primary conductor passage 4 for receiving the one or more primary conductors therethrough.

The magnetic core comprises a first part 15 and a second part 16 that define a first magnetic circuit gap 17a and a second magnetic circuit gap 17b between the first and second parts 15 and 16 of the magnetic core. The magnetic field detection system comprises a first magnetic field detector 18a mounted within the first magnetic circuit gap and a second magnetic field detector 18b mounted within the second magnetic circuit gap 17b. A magnetic circuit gap is also commonly known as an "airgap" even though the gap may be filled with non-magnetic materials other than air.

The magnetic field detectors may be Hall effect detectors, fluxgate detectors or other forms of magnetic field detectors per se well known in the art. Magnetic field detectors may advantageously be provided in the form of an ASIC (Application Specific Integrated Circuit) that is mounted and connected to a circuit board 19 of the electronic circuit 21.

The electronic circuit may further comprise a connector 20 for electrical connection to an external circuit to which the transducer is connected in use. The electronic circuit may comprise further circuit components on the circuit board 19 to process the signal from the magnetic field detectors 18a, 18b and provide power thereto. Such functions are per se well known and do not need to be further described herein.

The housing comprises a base housing 5 within which the electronic circuit 21 and the first part 15 of the magnetic core are received. The housing 2 further comprises a cover housing 8 within which the second part 16 of the magnetic core is mounted, the cover housing 8 being coupled to be base housing 5.

The base housing 5 comprises a first housing member 5a and the second housing member 5b that are assembled together and form one or more cavities therein to receive and lodge the electronic circuit and the first part 15 of the magnetic core. The second housing member 5b comprises in particular a magnetic core receiving portion 6 having cavities for lodging and positioning lateral branches 15a of the magnetic core first part 15. Within the lodging cavities, the magnetic field detectors 18a, 18b are also received adjacent an outer side of the lateral branches 15a.

The magnetic core first part 15 and second part 16 may be generally U-shaped, comprising lateral branches 15a, 16a interconnected by a bridging branch 15b. The lateral branches 15a of the first part 15 are spaced apart less than the lateral branches 16a of the second part, such that the lateral branches of the first part may be positioned within the space formed between the lateral branches 16 of the second part. Thus, an airgap 17a is formed between an outer side of a lateral branch 15a of the first part and an inner side of a lateral branch 16a of the second part.

The U-shapes of the first and second parts are arranged in an opposing manner to form the central passage therebetween with the lateral branches overlapping each other to form the airgaps between outer and inner lateral sides of the respective branches. Thus, if the first part is shifted laterally with respect to the second part, one of the airgaps will have a length G1 that reduces while the other airgap will have a length G2 that increases. The sum of the airgaps G1 plus G2 thus remains constant. An important advantage of this configuration is the reduced variation in the measurement of the magnetic field when summing outputs of the first and second magnetic field detectors compared to a conventional transducer where the airgaps are provided between opposing ends of the lateral branches arranged in mirror symmetry. In such prior art configurations, a shift in the position between the first and second magnetic core parts may change the length of both airgaps. Inaccuracies due to positional variations in the position of the magnetic core parts are thus present without any mitigating effect.

The magnetic core receiving portion 6 of the base housing 5 may advantageously comprise guide walls 7 on outer lateral sides of the receiving cavities 22 forming a guide surface 11 on an outer lateral side cooperating with the lateral branches 16a of the second part or guide walls on the cover housing 8 for positioning the lateral branches 16a of the second part 16 on outer side of the lateral branches 15a of the first part of the magnetic core. The guide walls 7 may advantageously have a tapered guide surface 11 at the upper ends to guide and position the cover as it is pivoted to the closed position.

The cover housing 8 may be coupled to the base housing 5 via a pivot coupling for instance comprising a pin 14 received in complementary holes in pivot lugs 13 of the cover housing, allowing the cover housing to be pivotally opened to receive a primary conductor in the primary conductor passage 4, as best seen in FIG. 1d. The cover housing can then be pivoted back the closed position where a latch 12 for instance clips on to the base housing 5 to secure to cover housing to the base housing in a closed position as best seen in FIG. 1c.

As per se known in split magnetic cores that allow the positioning of a primary conductor in a central passage, various other fixing mechanisms may be provided. For instance, the cover housing may be completely removable from the base housing and fixed together with a pair of latches, instead of having a pivot mechanism. Other coupling mechanisms for disassembly and assembly of the cover and base housings for opening the central passage to position a primary conductor therein may be provided.

An important advantage of the invention configuration in which the lateral branches overlap to form two airgaps is not only the reduced effect of inaccuracies in the relative lateral positioning, but also the reduced effect of inaccuracies in the spacing between the core parts, since whether the bridging branches are closer or further apart there is no change in the size of the airgap.

Figure 4:
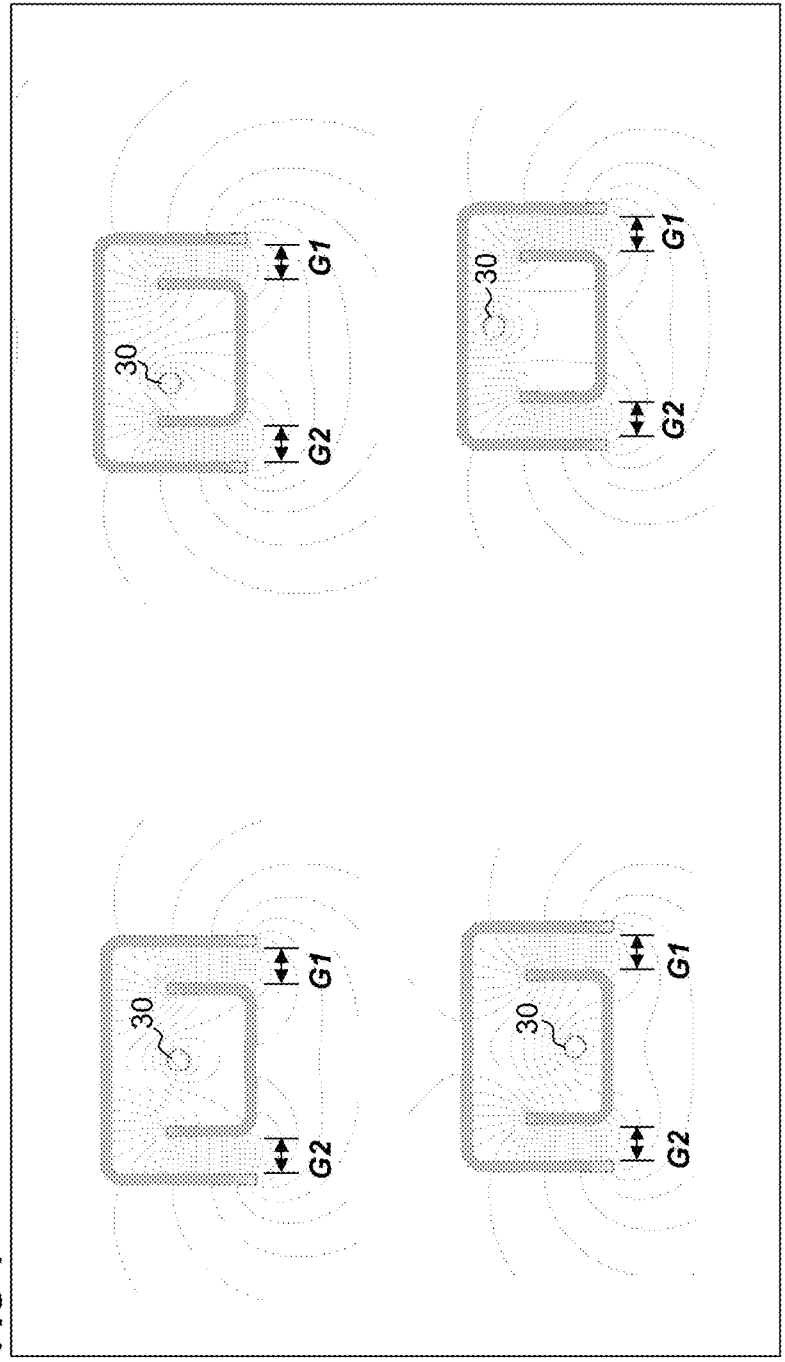
FIG. 4 is a schematic illustration of a magnetic circuit according to an embodiment of the invention illustrating magnetic field lines for a primary conductor in different positions within the central passage.
Figure 6:
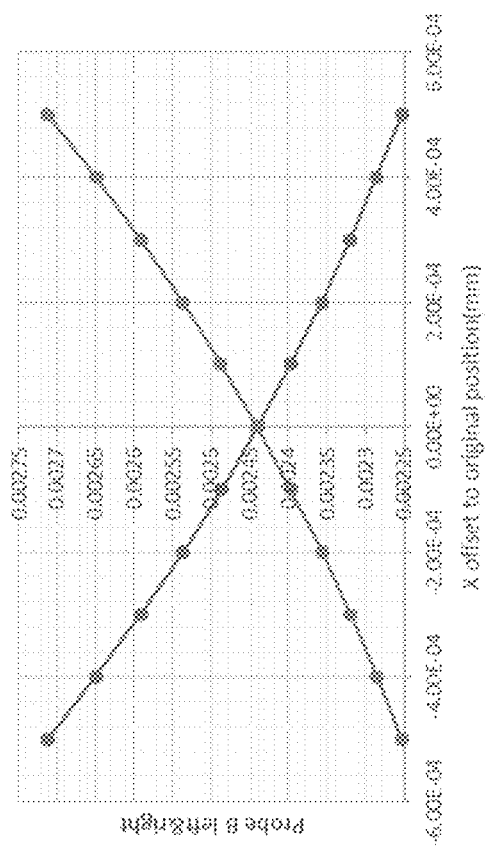
FIG. 6 is a plot of a magnetic field intensity in the first and second airgaps as a function of the length of the airgap depending on the offset of the first magnetic core with respect of the second magnetic core.
Figure 7:
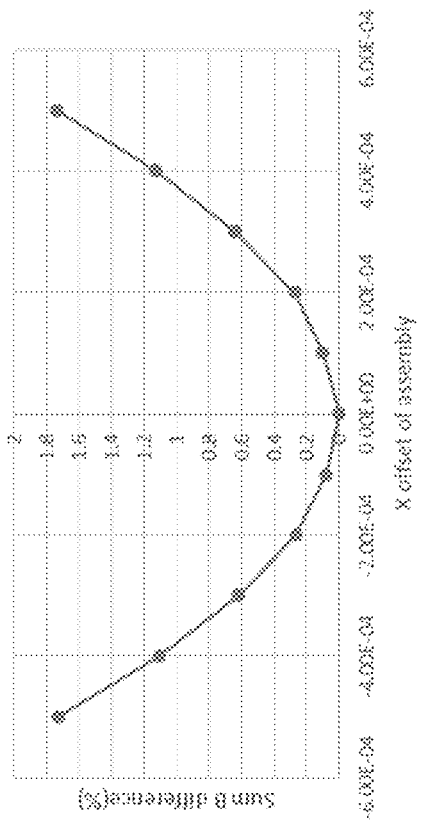
FIG. 7 is a plot illustrating the combined output of the first and second magnetic field detectors with the offset of the FIG. 6.
Figure 5:
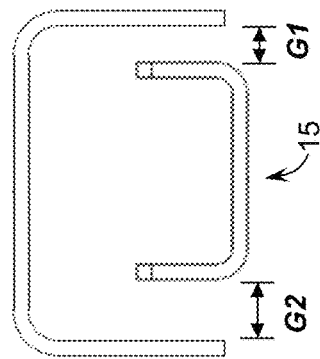
FIG. 5 is a schematic view of a magnetic core according to an embodiment of the invention illustrating (in an exaggerated manner) and a symmetry in the airgaps due to manufacturing and positional tolerances.

As best seen in the plot of FIG. 6, if the first part is shifted laterally with respect to the second part of the magnetic core, the length G1 of one airgap various inversely to the length G2 of the other airgap, however the sum G1+G2 remains constant. The effect is that inaccuracies in the positioning of the first and second magnetic core parts will have a reduced effect on the output of the magnetic field detectors. This arrangement also allows to reduce the effects of an off-center primary conductor 30 as illustrated in FIG. 4.

LIST OF REFERENCES USED electric current transducer 1
housing 2
primary conductor receiving portion 3
primary conductor passage 4
base housing 5
first housing member (base) 5a
second housing member 5b
magnetic core receiving portion 6
guide walls for lateral branches 7
guide surfaces 11
cover housing 8
third housing member 8a
magnetic core receiving portion 9
cavity 10
latch 12
pivot lugs 13
fourth housing member 8b
pivot coupling
pin 14
magnetic core
first part 15
lateral branches 15a
bridging branch 15b
second part 16
lateral branches 16a
bridging branch 16b
first magnetic circuit gap (airgap) 17a
second magnetic circuit gap (airgap) 17b
magnetic field detection system
first magnetic field detector 18a
second magnetic field detector 18b
electronic circuit 21
circuit board 19
connector 20
circuit components
first airgap length G1
second airgap length G2

The invention claimed is:

1. An electric current transducer comprising a housing, a magnetic core and a magnetic field detection system, the magnetic core surrounding a primary conductor passage for receiving a primary conductor therethrough, the magnetic core comprising a first part and a second part assembled in the housing so as to form a first magnetic circuit gap and a second magnetic circuit gap, the magnetic field detection system comprising a first magnetic field detector positioned in the first magnetic circuit gap and a second magnetic field detector positioned in the second magnetic circuit gap, the first and second magnetic circuit gaps being disposed on opposing sides of magnetic core, each of the first and second parts comprising a pair of lateral branches, joined by a bridging branch, wherein the lateral branches of the first and second magnetic core parts overlap such that the lateral branches of the first part of the magnetic core are positioned adjacent an inner side of the lateral branches of the second part of the magnetic core, said first and second magnetic circuit gaps being formed between an outer side of the lateral branches of the first part and an inner side of the lateral branches of second part.

2. The current transducer according to claim 1, wherein the magnetic core first part and second part are both U-shaped.

3. The current transducer according to claim 1, wherein the housing comprises a base housing and a cover housing movable with respect to the base housing from an open position in which the primary conductor can be placed in the primary conductor passage, to a closed and locked position in which the magnetic core completely surrounds the primary conductor passage, one of the first and second parts of the magnetic core being mounted in the base and the other of the first and second parts of the magnetic core being mounted in the cover.

4. The current transducer according to claim 1, wherein the cover housing is hingeably coupled to the base housing.

5. The current transducer according to claim 1, wherein the cover housing is removably coupled to the base housing.

6. The current transducer according to claim 1, wherein the lateral branches of the magnetic core first part are received in corresponding cavities in the base housing, the magnetic field detectors being mounted in said same cavities.

7. The current transducer according to claim 6, wherein the magnetic core receiving portions comprises outer guide walls for lateral branches having an outer surface guiding a complementary guide walls for lateral branches on the cover housing in the closed position.

8. The current transducer according to claim 7, wherein the guide walls are tapered.

9. The current transducer according to claim 1, wherein the first part of the magnetic core is positioned in the base housing and the second part of the magnetic core positioned in the cover housing.

10. The current transducer according to claim 9, wherein the magnetic field detectors are in the form of ASICs mounted on a circuit board of an electronic circuit mounted in the base housing.

11. The current transducer according to claim 10, wherein the ASICs are arranged upstanding orthogonally from the circuit board when positioned in corresponding cavities of the housing in abutment against the corresponding lateral branches of the first part of the magnetic core.

\* \* \* \* \*